: US 9,691,456 B2
(45) Date of Patent: Jun. 27, 2017

(54) RECONFIGURABLE SEMICONDUCTOR MEMORY APPARATUS AND OPERATING METHOD THEREOF

(71) Applicant: SK hynix Inc., Icheon-si Gyeonggi-do (KR)

(72) Inventors: Bo Ra Choi, Icheon-si (KR); Ji Hyae Bae, Icheon-si (KR); Jun Gi Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 46 days.

(21) Appl. No.: 14/684,502

(22) Filed: Apr. 13, 2015

(65) Prior Publication Data

US 2016/0217841 A1  Jul. 28, 2016

(30) Foreign Application Priority Data

Jan. 28, 2015  (KR) .................. 10-2015-0013403

(51) Int. Cl.
| G11C 11/00 | (2006.01) |
| G11C 8/18 | (2006.01) |
| G11C 8/10 | (2006.01) |
| G11C 8/12 | (2006.01) |
| G11C 7/20 | (2006.01) |
| G11C 29/44 | (2006.01) |

(52) U.S. Cl.
CPC ............ G11C 8/18 (2013.01); G11C 7/20 (2013.01); G11C 8/10 (2013.01); G11C 8/12 (2013.01); *G11C 2029/4402* (2013.01)

(58) Field of Classification Search
CPC ...... G11C 29/70; G11C 7/1006; G11C 7/1048; G11C 2029/4402; G11C 7/20; G11C 8/10; G11C 8/12; G11C 8/18
See application file for complete search history.

(56) References Cited

U.S. PATENT DOCUMENTS

| 3,882,470 | A | * | 5/1975 | Hunter | ............... G06F 12/0661 |
| | | | | | 365/200 |
| 5,923,599 | A | * | 7/1999 | Hii | ........................ G11C 29/20 |
| | | | | | 365/201 |
| 7,554,844 | B2 | * | 6/2009 | Werner | ................. G11O 5/145 |
| | | | | | 365/185.03 |
| 2014/0241043 | A1 | * | 8/2014 | Bae | ........................ G11C 29/44 |
| | | | | | 365/148 |
| 2014/0317460 | A1 | * | 10/2014 | Kleveland | ............. G11C 29/44 |
| | | | | | 714/710 |
| 2015/0098288 | A1 | * | 4/2015 | Bae | ................... G11C 11/40618 |
| | | | | | 365/222 |
| 2015/0324285 | A1 | * | 11/2015 | Murphy | .............. G06F 12/0292 |
| | | | | | 711/6 |
| 2016/0055920 | A1 | * | 2/2016 | Lee | ........................ G11C 17/18 |
| | | | | | 365/96 |

FOREIGN PATENT DOCUMENTS

| KR | 1020110030779 A | 3/2011 |
| KR | 1020110057646 A | 6/2011 |

\* cited by examiner

*Primary Examiner* — Hien Nguyen
(74) *Attorney, Agent, or Firm* — William Park & Associates Ltd.

(57) ABSTRACT

A reconfigurable semiconductor memory apparatus may include a memory cell array including a plurality of sub arrays. The reconfigurable semiconductor memory apparatus may include an information storage unit configured to store status information for each sub array, and a reset address according to the status information.

13 Claims, 7 Drawing Sheets

RECONFIGURABLE SEMICONDUCTOR MEMORY APPARATUS AND OPERATING METHOD THEREOF

CROSS-REFERENCES TO RELATED APPLICATION

This application claims priority under 35 U.S.C. 119(a) to Korean application No. 10-2015-0013403, filed on Jan. 28, 2015, in the Korean intellectual property Office, which is incorporated by reference in its entirety as set forth in full.

BACKGROUND

1. Technical Field

Various embodiments generally relate to a semiconductor integrated circuit device, and more particularly, to a reconfigurable semiconductor memory apparatus and an operation method thereof.

2. Related Art

Semiconductor memory apparatuses are storage apparatuses for storing data. The semiconductor memory apparatuses may read the stored data if necessary. The semiconductor memory apparatuses may be used as a main storage apparatus or an auxiliary storage apparatus of various electric apparatuses.

Demands for increasing the amount of data processing processed in an electronic apparatus, and demands for high-speed processing of the data, while desiring the semiconductor memory apparatus to have higher capacities, but be smaller, lighter, and thinner have driven the study of semiconductor memory apparatuses.

SUMMARY

According to an embodiment, there may be provided a reconfigurable semiconductor memory apparatus. The reconfigurable semiconductor memory apparatus may include a memory cell array including a plurality of sub arrays. The reconfigurable semiconductor memory apparatus may include an information storage unit configured to store status information for each sub array, and a reset address according to the status information of the sub array.

According to an embodiment, there may be provided a reconfigurable semiconductor memory apparatus. The reconfigurable semiconductor memory apparatus may include a memory cell array including a plurality of semiconductor chips mounted on a surface of a printed circuit board (PCB), at least one of the plurality of semiconductor chips including a plurality of sub arrays. The reconfigurable semiconductor memory apparatus may include an information storage unit configured to store status information indicating whether or not each of the plurality of sub arrays has operated normally, and a reset address according to the status information of the sub array.

According to an embodiment, there may be provided an operation method of a reconfigurable semiconductor memory apparatus including a memory cell array including a plurality of sub arrays, and an information storage unit. The operation method may include storing status information for each of the plurality of sub arrays in the information storage unit. The operation method of the reconfigurable semiconductor memory apparatus may include assigning a reset address to the sub array based on the status information and storing the reset address in the information storage unit.

DETAILED DESCRIPTION

Figure 1:
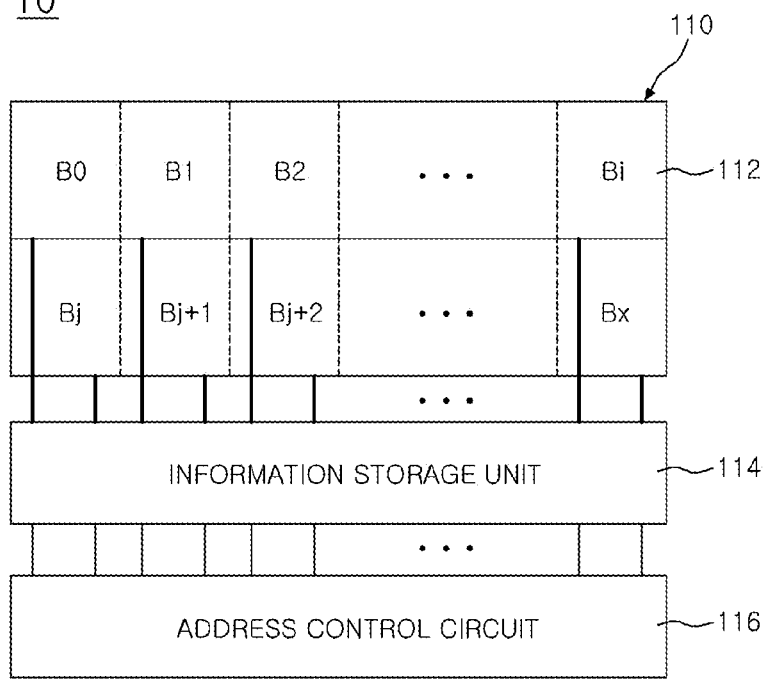
FIG. 1 is a configuration view illustrating a representation of an example of a reconfigurable semiconductor memory apparatuses according to an embodiment.

Various examples of embodiments will be described below with reference to the accompanying drawings. Various examples of embodiments are described herein with reference to cross-sectional illustrations that are schematic illustrations of various examples of embodiments (and intermediate structures). Variations from the shapes of the illustrations as a result, for example, of manufacturing techniques and/or tolerances, are to be expected. Embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The various examples of embodiments are described herein with reference to cross-section and/or plan illustrations that are schematic illustrations. However, the embodiments should not be limited. Although a various examples of the embodiments will be illustrated and described, it will be appreciated by those of ordinary skill in the art that changes may be made to these various examples of embodiments without departing from the principles and spirit of the application.

Various embodiments may relate to, for example, one semiconductor memory chip including a plurality of sub arrays configured to be independently activated. Each of the sub arrays may be controlled through an interleaving method, and thus an operation for accessing one sub array an operation for accessing another sub array may be performed in parallel.

The capacity of the semiconductor memory apparatus including the plurality of sub arrays may be determined according to the capacity of the unit sub array and the number of sub arrays.

Referring to FIG. 1, FIG. 1 is a configuration view illustrating a representation of an example of a reconfigurable semiconductor memory apparatus according to an embodiment.

A reconfigurable semiconductor memory apparatus 10 according to an embodiment may include a memory cell array 110, an information storage unit 114, and an address control circuit 116.

The memory cell array 110 may include a plurality of memory cells coupled between word lines (not illustrated) and bit lines (not illustrated). The memory cell array 110 may be divided into sub arrays (B0 to Bx) 112 having a preset size.

The sub arrays (B0 to Bx) 112 may be independently activated, and may be controlled through an interleaving method. Each of the sub arrays may be controlled through an interleaving method. An operation for accessing one sub array an operation for accessing another sub array may be performed in parallel.

The information storage unit 114 may store pieces of status information for the sub arrays (B0 to Bx) 112, for example, PASS/FAIL of the sub arrays. The information storage unit 114 may store reset addresses determined according to the pieces of status information of the sub array (B0 to Bx) 112, respectively. The information storage unit 114 according to an example of an embodiment may be a set of information storage circuits provided to the sub arrays (B0 to Bx) 112, respectively.

In an embodiment, a region in which the memory cell array 110 is arranged may be called a core region. In an embodiment the information storage unit 114 and the address control circuit 116 may be arranged in a peripheral region.

Figure 2:
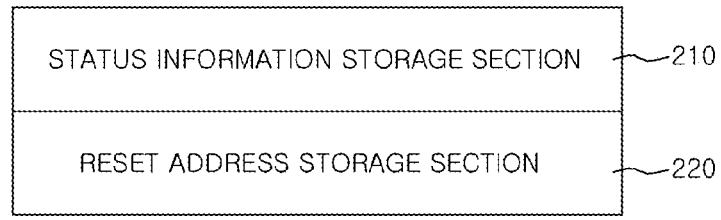
FIG. 2 is a conceptual view illustrating a representation of an example of an information storage circuit according to an embodiment.

FIG. 2 illustrates an example of an information storage circuit provided in each of the sub arrays (B0 to Bx).

Referring to FIG. 2, an information storage circuit 20 may include a status information storage section 210 and a reset address storage section 220.

A test operation after the semiconductor memory apparatus 10 is fabricated, for example, a package test operation may check whether or not the sub arrays (B0 to Bx) 112 are normally operating. The information indicating whether a corresponding sub array (B0 to Bx) 112 has operated normally (PASS) or has not operated normally (FAIL) according to the test result may be stored in the status information storage section 210.

All the plurality of sub arrays (B0 to Bx) 112 may be operating normally, or the plurality of sub arrays (B0 to Bx) 112 may not be operating normally. When a portion of the sub arrays has not operated normally, it is not preferable that the whole semiconductor memory apparatus 10 be discarded. Therefore, in an embodiment, the semiconductor memory apparatus may be reconfigured with only normally operating sub arrays.

Initial addresses may be set to the sub arrays 112 B0 to Bx. Therefore, it may be necessary to reset only addresses of the normally operating sub arrays to reconfigure the semiconductor memory apparatus only using the sub arrays that have operated normally. The reset addresses for the corresponding sub arrays may be stored in the reset address storage sections 220 of the information storages circuit 20 provided in the normally operating sub arrays, respectively.

When the addresses of the normally operating sub arrays among the plurality of sub arrays (B0 to Bx) 112 constituting the single semiconductor memory apparatus 10 are reset, the reset addresses are assigned not to overlap each other. The reset addresses may be assigned with consecutive logic values.

The preset logic values may be stored in the reset address storage sections 220 of the information storage circuits 20 provided in sub arrays that have abnormally operated. The logic values may be set to values which may not overlap the reset addresses assigned to the normally operating sub arrays.

The information storage unit 114 or the information storage circuit 20 in an embodiment may be configured of a fuse, but this is not limited thereto. For example, as the information storage unit 114 or the information storage circuit 20, any configuration which may store the PASS/FAIL information and the reset addresses of the sub arrays (B0 to Bx) 112 may be adapted.

When portions of the sub arrays in the memory cell array 110 are not operating normally, addresses for the normally operating sub arrays are reset, and the semiconductor memory apparatus is reconfigured, a sub array corresponding to an external address has to be selected to respond to an access request of an external apparatus such as, for example but not limited to, a host.

For example, the address control circuit 116 may be configured to receive an external address, compare the external address with the reset address stored in the information storage unit 114, and generate a bank selection signal.

Figure 3:
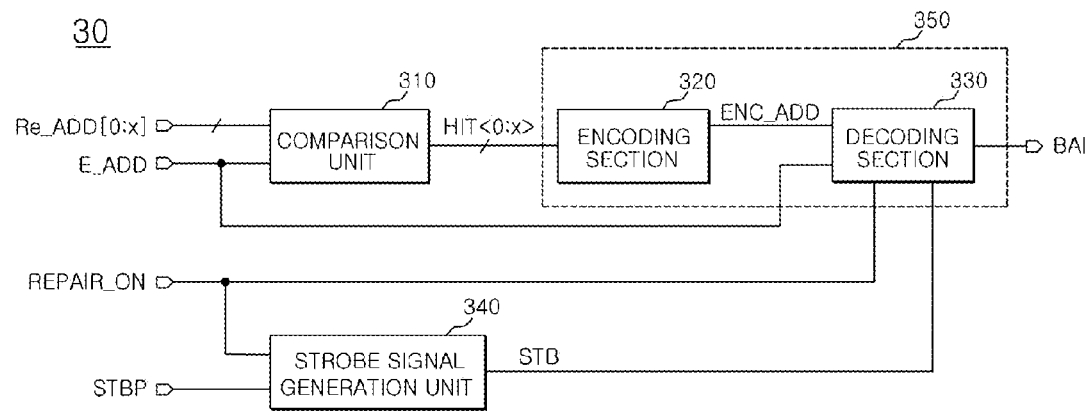
FIG. 3 is a configuration view illustrating a representation of an example of an address control circuit according to an embodiment.

FIG. 3 is a configuration view illustrating a representation of an example of an address control circuit according to an embodiment.

Referring to FIG. 3, the address control signal 30 may be configured to include a comparison unit 310, a strobe signal generation unit 340, and an address generation unit 350.

The comparison unit 310 may compare a reset address Re_ADD[0:x] received from each of the information storage circuits 20 in the information storage unit 114 and an external address E_ADD, and generate an address hit signal HIT<0:x>.

The strobe signal generation unit 340 may generate a bank selection strobe signal STB. The strobe signal generation unit 340 may generate the bank selection strobe signal STB in response to a reconfiguration enable signal REPAIR_ON and a strobe pulse STRP.

The address generation unit 350 may generate a bank selection signal BAI based on the address hit signal HIT<0:x> and the external address E_ADD in response to the reconfiguration enable signal REPAIR_ON and the bank selection strobe signal STB.

As an example, the address generation unit 350 may be configured to include an encoding section 320 and a decoding section 330.

The encoding section 320 may receive the address hit signal HIT<0:x>, convert the received address hit signal HIT<0:x> into a signal corresponding to the number of preset bits, and generate an encoding address ENC_ADD. The number of preset bits may be, for example, the number of bits of an address signal assigned to a unit sub array. In an embodiment, when the number of sub arrays is 16, the number of bits of the address signal may be 4.

The decoding section 330 may select one of the encoding address ENC_ADD and the external address E_ADD in response to the reconfiguration enable signal REPAIR_ON. The decoding section 330 may output the selected address as the bank selection signal BAI in synchronization with the bank selection strobe signal STB.

For example, the comparison unit 310 may be configured to determinate a sub array of which an address is reset to the same address as the external address E_ADD, and generate the address hit signal HIT<0:x> according to the determination result. When the reconfiguration enable signal REPAIR_ON is enabled, that is, when the semiconductor memory apparatus 10 is reconfigured of only the normally operated sub arrays, the address generation unit 350 may be configured to generate the bank selection signal BAI based on the address hit signal HIT<0:x> output from the comparison unit 310. When the reconfiguration enable signal REPAIR_ON is disabled, that is, when the semiconductor memory apparatus 10 is not reconfigured, the address generation unit 350 may generate the bank selection signal BAI based on the external address E_ADD.

Figure 4:
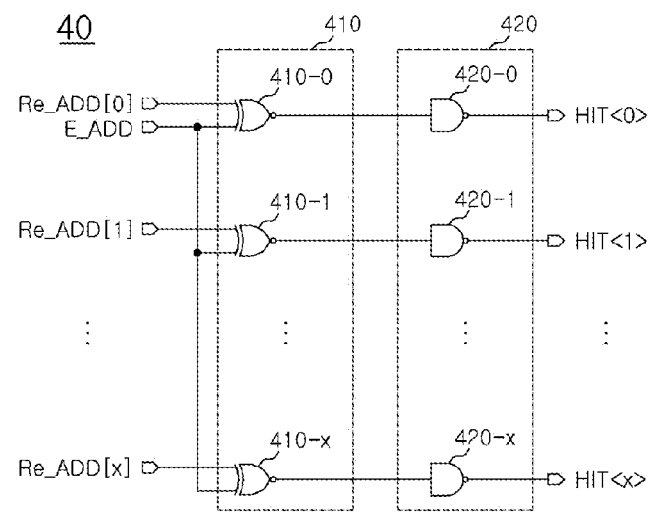
FIG. 4 is a configuration view illustrating a representation of an example of a comparison unit according to an embodiment.

FIG. 4 is a configuration view illustrating a representation of an example of a comparison unit according to an embodiment.

Referring to FIG. 4, a comparison unit 40 may include, for example, a comparison circuit 410 and a combination circuit 420.

The comparison unit 410 may compare the reset address Re_ADD provided from the reset address storage section 220 with the external address E_ADD to check whether or not the same reset address as the external address E_ADD is stored. For example, the comparison circuit 410 may be configured to include a plurality of circuits 410-0 to 410-x configured to perform a logic operation, for example, an XNOR operation, but the configuration of the comparison circuit 410 is not limited thereto.

The number of circuits 410-0 to 410-x in the comparison circuit 410 may correspond to the number x+1 of sub arrays. Each of the circuits 410-0 to 410-x in the comparison circuit 410 may compare the reset address Re_ADD stored in the reset address storage section 220 of each of the sub arrays with the external address E_ADD.

Output signals of the circuits 410-0 to 410-x in the comparison circuit 410 may be provided to the combination circuit 420. The combination unit 420 may generate the address hit signal HIT<0:x> based on the output signals of the circuits 410-0 to 410-x.

For example, the combination circuit 420 may be configured to include a plurality of circuits 420-0 to 420-x which may perform a logic operation, for example, an NAND operation, but the configuration of the combination circuit 420 is not limited thereto. So as to combine the outputs of the circuits 410-0 to 410-x of the comparison circuit 410, the combination circuit 420 may be configured to include circuits 420-0 to 420-x so that the number of circuits 420-0 to 420-x in the combination circuit 420 may correspond to the number of circuits 410-0 to 410-x in the comparison circuit 410, that is, the number x+1 of sub arrays.

The configuration of the comparison unit 40 illustrated in FIG. 4 is an example, and any configuration, which may compare the reset address Re_ADD with the external address E_ADD, and detect whether or not a reset address matching with the external address is presented, may be applied to the comparison unit 40.

Figure 5:
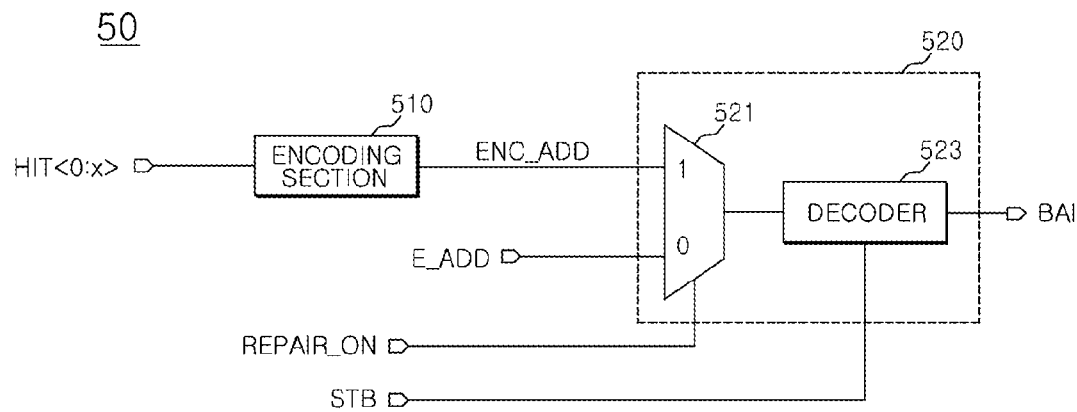
FIG. 5 is a configuration view illustrating a representation of an example of an address generation unit according to an embodiment.

FIG. 5 is a configuration view illustrating a representation of an example of an address generation unit according to an embodiment.

Referring to FIG. 5, the address generation unit 50 may include an encoding section 510 and a decoding section 520.

The encoding section 510 may receive the address hit signal HIT<0:x>, and generate the encoding address ENC_ADD corresponding to the number of preset bits. The number of preset bits may be the number of bits of the address signal assigned to the unit sub array.

The decoding section 520 may include a selector 521 and a decoder 523.

The selector 521 may receive the encoding address ENC_ADD and the external address E_ADD, and select one of the encoding address ENC_ADD and the external address E_ADD in response to the reconfiguration enable signal REPAIR_ON.

The decoder 523 may output the address selected in the selector 521 as the bank selection signal BAI in response to the bank selection strobe signal STB.

Figure 6:
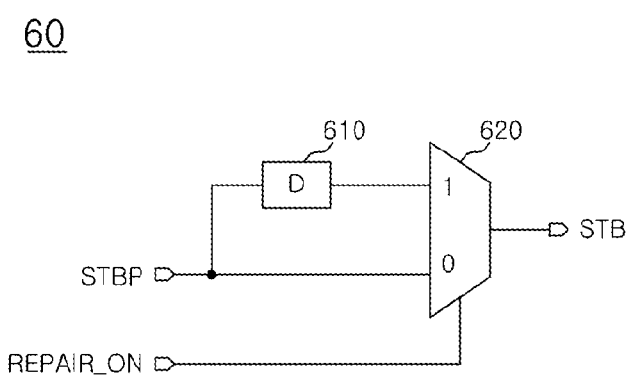
FIG. 6 is a configuration view illustrating a representation of an example of a strobe signal generation unit according to an embodiment.

The strobe signal STB may be generated, for example, through a strobe signal generation unit 60 illustrated in FIG. 6.

The strobe signal generation unit 60 illustrated in FIG. 6 may include a delay section 610 and a selection section 620.

The delay section 610 may delay the strobe pulse STBP by a preset time. The selection section 620 may select one of the strobe pulse STBP and the delayed strobe pulse STBP in response to the reconfiguration enable signal REPAIR_ON signal. The selection section 620 may output the selected pulse as the bank selection strobe signal STB.

The delay time of the delay section 610 configured to delay the strobe pulse STBP may be set to have a margin from a point of time when the reconfiguration enable signal REPAIR_ON is enabled to a point of time when the reset address stored in the information storage unit 114 is decoded through the decoder 523 (i.e., see FIG. 5).

In an embodiment, when the portions of the sub arrays 112 constituting the memory cell array 110 of the semiconductor memory apparatus 10 are not operating normally, the semiconductor memory apparatus 10 may be reconfigured of only the sub arrays that are operating normally. The reset addresses may be assigned to the normally operating sub arrays, respectively.

When the external address is provided from an external apparatus, the semiconductor memory apparatus 10 may detect a sub array to which a reset address matching with the external address is assigned, and control the selected sub array to be accessed.

Figure 7:
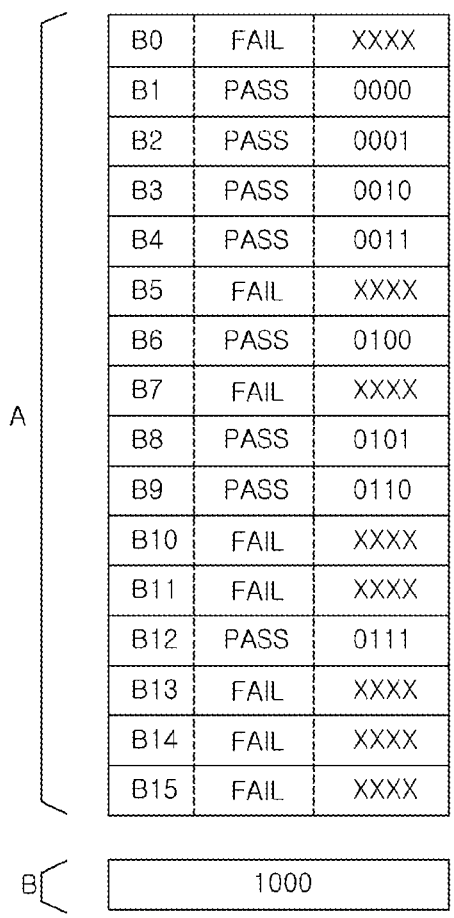
FIG. 7 is a view for explaining an information storage example of an information storage unit according to a sub array.

FIG. 7 is a view for explaining an information storage example of an information storage unit in each sub array.

Referring to FIG. 7, FIG. 7 illustrates a semiconductor memory apparatus having, for example, 16 sub arrays B0 to B15. It may be assumed that through a test process for the sub arrays B0 to B15, sub arrays B0, B5, B7, B10, B11, B13, B14, and B15 among the sub arrays B0 to B15 are determined as a FAIL, and the other sub arrays B1, B2, B3, B4, B6, B8, B9, and B12 are determined to have passed PASS.

'FAIL' information as the status information may be stored in each of the status information storage sections 210 of the sub arrays B0, B5, B7, B10, B11, B13, B14, and B15, which are determined to have failed FAIL, among the information storage circuits A in the sub arrays B0 to B15, and a preset logic value XXXX may be stored in each of the reset address storage sections 220 of the sub arrays B0, B5, B7, B10, B11, B13, B14, and B15.

'PASS' information may be stored in each of the status information storage sections 210 of the normally operating sub arrays B1, B2, B3, B4, B6, B8, B9, and B12, and reset addresses 0000, 0001, 0010, 0011, 0100, 0101, 0110, 0111, which do not overlap each other, may be stored in the reset address storage sections 220 of the sub arrays B0, B5, B7, B10, B11, B13, B14, and B15, respectively.

A region 'B' in FIG. 7 may be a region in which the number of normally operating sub arrays among the sub arrays in the corresponding semiconductor memory apparatus is stored, and will be described later. The number of sub arrays that have normally operated in FIG. 7 is 8, and thus a binary number 1000 may be stored in the region 'B'.

It may be assumed that information as in FIG. 7 is stored in the information storage unit 114, and '0100' as the external address E_ADD is input.

In this example, the address hit signal HIT<0:x> output from the comparison unit 310 and 40 and the encoding address ENC_ADD output from the encoding section 320 and 510 may be the same as the following Table 1.

through the test equipment (S105) (i.e., ACCESS TO RESET ADDRESS STORAGE UNIT), and the status information of a corresponding sub array may be checked (S107) (i.e., PASS?). When the status of the corresponding sub array is normal, that is, PASS (S107-Y), an address for the corresponding sub array is reset (S109) (i.e., RESET ADDRESS). A process for determining whether or not currently accessed sub array is the last sub array is performed (S111) (i.e., LAST SUB ARRAY?). When it is determined that the currently accessed sub array is the last sub array (S111-Y), the address reset process may be completed (i.e., END).

When the currently accessed sub array is not the last sub array (S111-N), access to the reset address storage section 220 provided to next sub array is performed (S113) (i.e., ACCESS TO RESET ADDRESS STORAGE UNIT OF NEXT SUB ARRAY), and the subsequent processes from operation S107 are repeatedly performed.

In operation S107, when the status of the corresponding sub array is FAIL (S107-N), the corresponding sub array may be invalidated so as not to be accessed (S115) (i.e., INVALIDATE).

In an embodiment, after the address reset process for all the sub arrays is completed, operation S117 (i.e., STORE

TABLE 1

A method of implementing the reconfigurable semiconductor apparatus 10 using the normally operated sub arrays will be described with reference to FIG. 8.

| HIT<#> | | | | | | | | | | | | | | | | ENC_ADD<#> | | | |
|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 3 | 2 | 1 | 0 |
| 1 | 0 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 | 0 | 1 |
| 0 | 0 | 1 | 0 | 0 | 0 | 0 | 0 | 0 | 0 | 0 | 0 | 0 | 0 | 0 | 0 | 0 | 0 | 1 | 0 |
| 0 | 0 | 0 | 1 | 0 | 0 | 0 | 0 | 0 | 0 | 0 | 0 | 0 | 0 | 0 | 0 | 0 | 0 | 1 | 1 |
| 0 | 0 | 0 | 0 | 1 | 0 | 0 | 0 | 0 | 0 | 0 | 0 | 0 | 0 | 0 | 0 | 0 | 1 | 0 | 0 |
| 0 | 0 | 0 | 0 | 0 | 1 | 0 | 0 | 0 | 0 | 0 | 0 | 0 | 0 | 0 | 0 | 0 | 1 | 0 | 1 |
| 0 | 0 | 0 | 0 | 0 | 0 | 1 | 0 | 0 | 0 | 0 | 0 | 0 | 0 | 0 | 0 | 0 | 1 | 1 | 0 |
| 0 | 0 | 0 | 0 | 0 | 0 | 0 | 1 | 0 | 0 | 0 | 0 | 0 | 0 | 0 | 0 | 0 | 1 | 1 | 1 |
| 0 | 0 | 0 | 0 | 0 | 0 | 0 | 0 | 1 | 0 | 0 | 0 | 0 | 0 | 0 | 0 | 1 | 0 | 0 | 0 |
| 0 | 0 | 0 | 0 | 0 | 0 | 0 | 0 | 0 | 1 | 0 | 0 | 0 | 0 | 0 | 0 | 1 | 0 | 0 | 1 |
| 0 | 0 | 0 | 0 | 0 | 0 | 0 | 0 | 0 | 0 | 1 | 0 | 0 | 0 | 0 | 0 | 1 | 0 | 1 | 0 |
| 0 | 0 | 0 | 0 | 0 | 0 | 0 | 0 | 0 | 0 | 0 | 1 | 0 | 0 | 0 | 0 | 1 | 0 | 1 | 1 |
| 0 | 0 | 0 | 0 | 0 | 0 | 0 | 0 | 0 | 0 | 0 | 0 | 1 | 0 | 0 | 0 | 1 | 1 | 0 | 0 |
| 0 | 0 | 0 | 0 | 0 | 0 | 0 | 0 | 0 | 0 | 0 | 0 | 0 | 1 | 0 | 0 | 1 | 1 | 0 | 1 |
| 0 | 0 | 0 | 0 | 0 | 0 | 0 | 0 | 0 | 0 | 0 | 0 | 0 | 0 | 1 | 0 | 1 | 1 | 1 | 0 |
| 0 | 0 | 0 | 0 | 0 | 0 | 0 | 0 | 0 | 0 | 0 | 0 | 0 | 0 | 0 | 1 | 1 | 1 | 1 | 1 |

Figure 8:
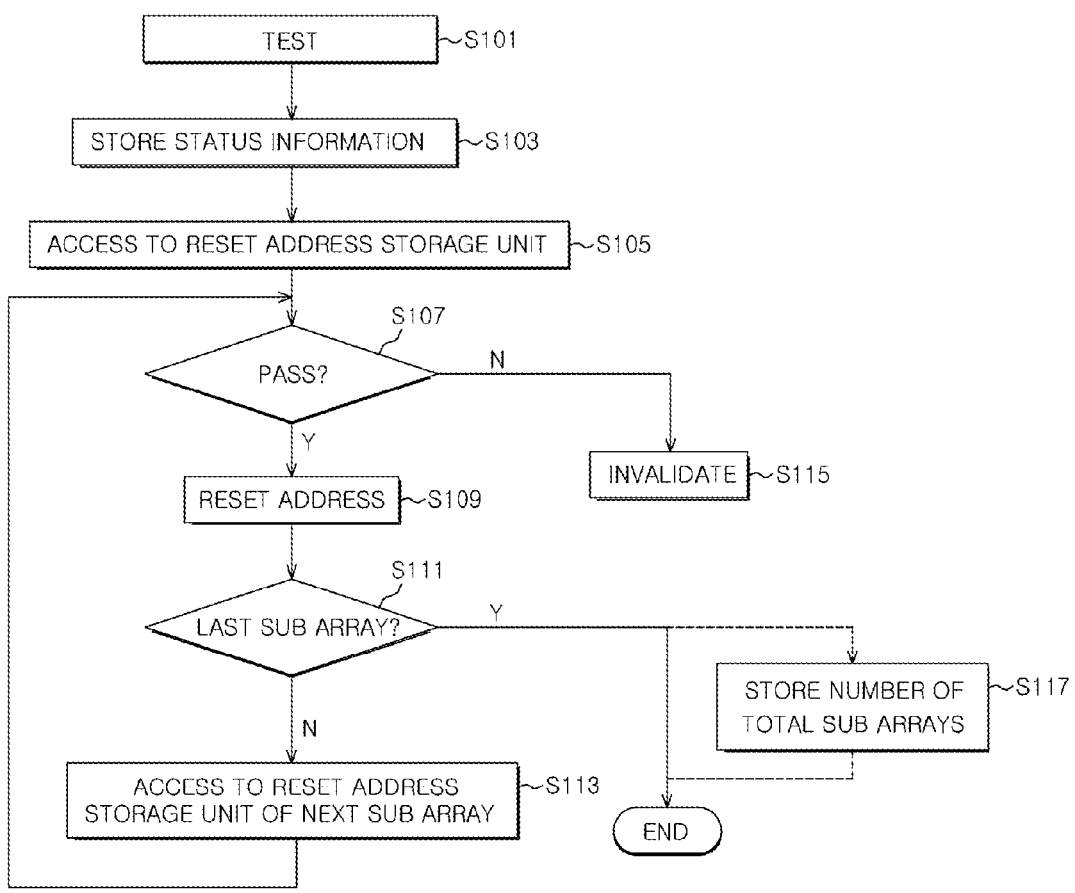
FIG. 8 is a view for explaining an operation method of a semiconductor memory apparatus according to an embodiment.

FIG. 8 is a view for explaining an operation method of a semiconductor memory apparatus according to an exemplary embodiment.

Referring to FIG. 8, first, after the semiconductor memory apparatus 10 is fabricated, a test process may be performed on the semiconductor memory apparatus 10 through test equipment (S101) (i.e., TEST). For example, the test process may be performed in a packaging stage, but the test process is not limited thereto.

PASS/FAIL for the sub arrays (B0 to Bx) 112 may be determined according to a test result, and status information according to PASS/FAIL may be stored in the status information storage section 210 of each of the information storage circuits 20 provided in the sub arrays (B0 to Bx) 112 through the test equipment (S103) (i.e., STORE STATUS INFORMATION).

When the storage of the status information is completed, the status information storage sections 210 provided in the sub arrays (B0 to Bx) 112 may be sequentially accessed NUMBER OF TOTAL SUB ARRAYS) for storing the number of sub arrays determined in a PASS status may be further performed.

The region (see B of FIG. 7) in which the number of normally operated sub arrays among the sub arrays in the semiconductor memory apparatus is stored has been described in FIGS. 7 and 8.

Figure 9:
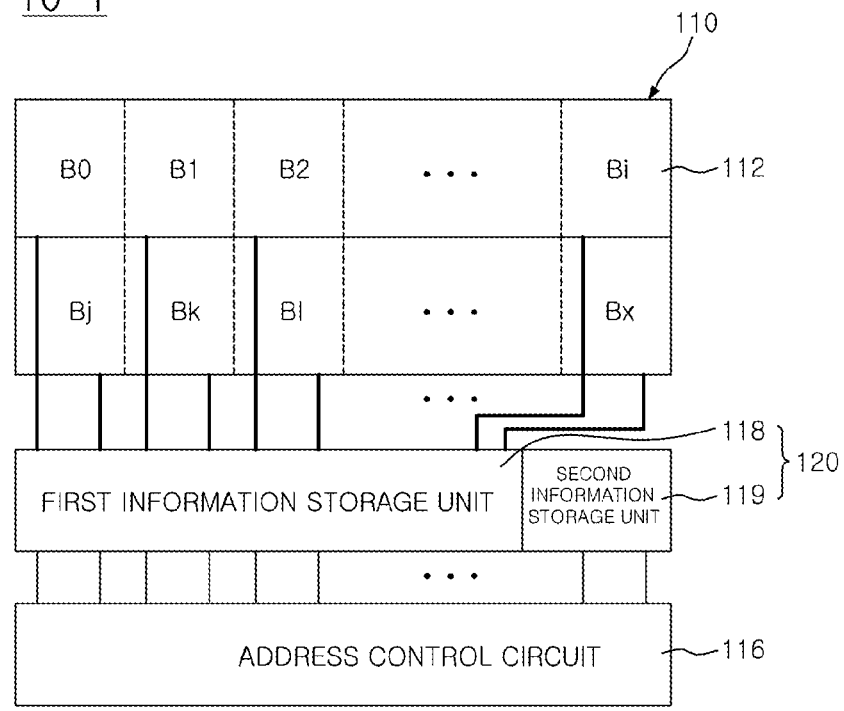
FIG. 9 is a configuration view illustrating a representation of an example of a reconfigurable semiconductor memory apparatus according to an embodiment.

FIG. 9 illustrates a configuration view of a semiconductor memory apparatus 10-1 further including an information storage unit configured to store capacity information.

Referring to FIGS. 1 and 9, configurations of a memory cell array 110 including a plurality of sub arrays 112 and an address control circuit 116 of the semiconductor memory apparatus 10-1 may be substantially similar to the configurations of the memory cell array 110 and the address control circuit 116 in the semiconductor memory apparatus 10.

The reconfigurable semiconductor memory apparatus 10-1 according to an embodiment may further include the information storage unit 120 in addition to the above components. The information storage unit 120 may include a first information storage unit 118 and a second information storage unit 119.

The first information storage unit 118 may be substantially similar to the information storage unit 114 of the semiconductor memory apparatus 10 illustrated in FIG. 1, and may be a set of information storage circuits which are provided to the sub arrays, respectively.

The capacity information may be stored in the second information storage unit 119. The capacity information may be the number of sub arrays determined to PASS. For example, the region B illustrated in FIG. 7 may be the second information storage unit 119. Since the number of sub arrays determined to PASS is 8 in the example of FIG. 7, the binary number 1000 may be stored in the second information storage unit 119.

In an embodiment, a region in which the memory cell array 100 is arranged may be called a core region, and the information storage unit 120 and the address control circuit 116 may be arranged in a peripheral region.

In an embodiment illustrated in FIG. 8, after the address reset process is completed, a process of storing the number of sub arrays determined to have a PASS status in operation S117 is accompanied, and the number of sub arrays determined to have a PASS status may be stored in the second information storage unit 119.

When the number of accessible sub arrays is stored in advance, and the number of accessible sub arrays may be provided according to the request of an external apparatus, substantial capacity of a corresponding semiconductor memory apparatus may be easily checked.

The reconfigurable memory apparatuses 10 and 10-1 described above may be configured in a module type memory.

Figure 10:
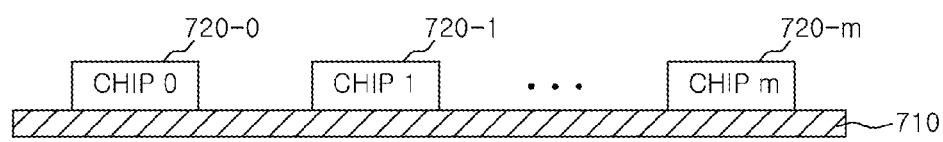
FIG. 10 is a configuration view illustrating a representation of an example of a semiconductor memory module according to an embodiment.

For example, as illustrated in FIG. 10, a plurality of chips 720-0 to 720-m may be mounted on one surface of a printed circuit board (PCB) 710. A memory module 70 illustrated in FIG. 10 may be, for example, a single in line memory module (SIMM).

Figure 11:
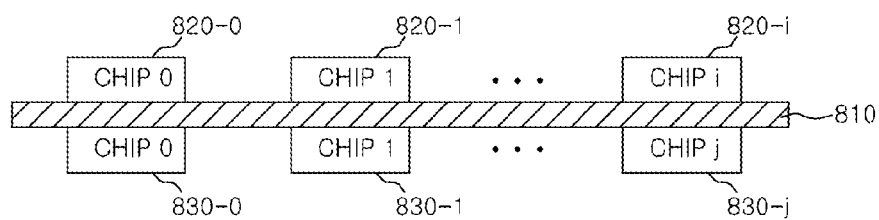
FIG. 11 is a configuration view illustrating a representation of an example of a semiconductor memory module according to an embodiment.

A memory module 80 illustrated in FIG. 11 may be, for example, a dual in line memory module (DIMM). In an embodiment, as illustrated in FIG. 11, the reconfigurable semiconductor memory apparatus may be configured in a dual in line memory module (DIMM) type in which a plurality of chips 820-0 to 820-i and 830-0 to 830-j are mounted on both surfaces of a PCB 810.

At least one among the chips 720-0 to 720-m, 820-0 to 820-i, and 830-0 to 830-j illustrated in FIGS. 10 and 11 may be the reconfigurable semiconductor memory apparatus 10 or 10-1 illustrated in FIG. 1 or 9.

The module type illustrated in FIGS. 10 and 11 are merely examples, and any type in which a plurality of chips are mounted on a single PCB may be understood as a memory module.

Figure 12:
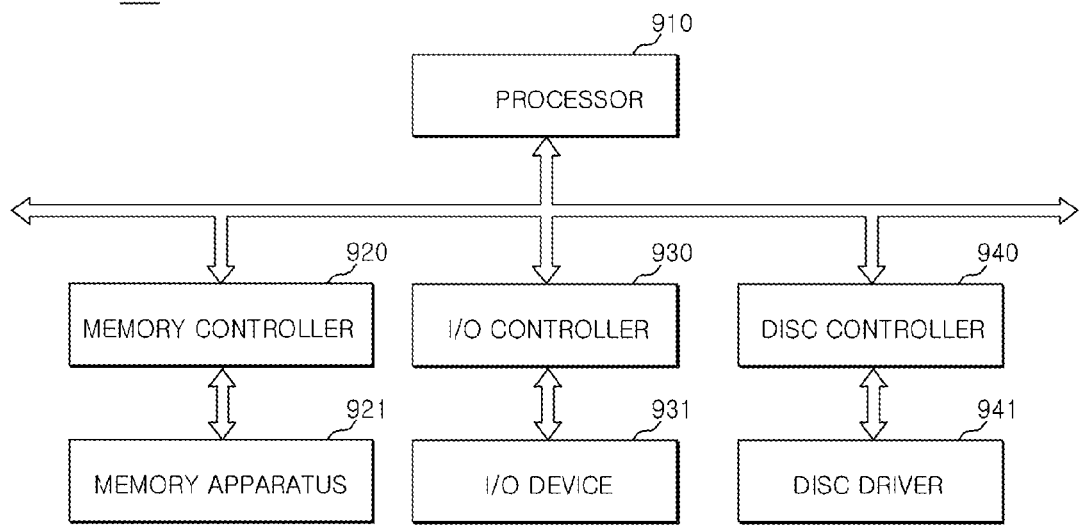
FIG. 12 is a configuration view illustrating a representation of an example of an electronic system according to an embodiment.

FIG. 12 is a configuration view illustrating a representation of an example of an electronic system according to an embodiment.

Referring to FIG. 12, an electronic system 90 according to an embodiment may include a processor 910, a memory controller 920, and a memory apparatus 921. The electronic system 90 may include an input/output (I/O) controller 930, an I/O device 931, a disc controller 940, and a disc driver 941.

At least one processor 910 may be provided, and may be independently operated of other processors or may be operated in conjunction with the other processors. The processor 910 may have an environment to communicate with other components, for example, the memory controller 920, the I/O controller 930, and the disc controller 940 through buses (a control bus, an address bus, and a data bus).

The memory controller 920 is coupled to at least one memory apparatus 921. The memory controller 920 may receive a request from the processor 910, and may control the at least one memory apparatus 921 based on the request.

The memory apparatus 921 may be, for example, the above-described reconfigurable semiconductor memory apparatus 10 or 10-1.

The I/O controller 930 may be connected between the process 910 and the I/O device 931, and transmit an input from the I/O device to the processor 910 or provide a processing result of the processor 910 to the I/O device 931. The I/O device 931 may include an input device such as for example but not limited to a key board, a mouse, a touch screen, or a microphone, and an output device such as a display or a speaker, etc.

The disc controller 940 may control at least one disc driver 941 according to the control of the processor 910.

In the electronic system 90, when an access to the memory apparatus 910 is requested by the processor 910, the address control circuit 116 of the memory apparatus 921 may detect a sub array to which the reset address matching with an external address is assigned, and control the detected sub array to be accessed.

The above embodiments are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A reconfigurable semiconductor memory apparatus comprising:
a memory cell array including a plurality of sub arrays;
an information storage unit configured to store status information for each sub array, and a reset address according to the status information of the sub array; and
an address control circuit,
wherein the address control circuit includes:
a comparison unit configured to compare the reset address with an external address, and generate an address hit signal for designating a sub array matching the external address; and
a decoder configured to generate a bank selection signal based on the address hit signal or the external address in response to a reconfiguration enable signal.

2. The reconfigurable semiconductor memory apparatus of claim 1, wherein the status information includes information indicating whether or not the sub array has operated normally.

3. The reconfigurable semiconductor memory apparatus of claim 1, wherein the reset address is assigned to each sub array among the sub arrays that have operated normally.

4. The reconfigurable semiconductor memory apparatus of claim 1, wherein the information storage unit stores the number of sub arrays that have operated normally among the sub arrays.

5. The reconfigurable semiconductor memory apparatus of claim 1, wherein the address control circuit configured to detect a sub array, the sub array assigned to a reset address matching with the external address, when the external address is input, and an access to the memory cell array is requested.

6. The reconfigurable semiconductor memory apparatus of claim 1, wherein the decoder generates the bank selection signal from the address hit signal when the reconfiguration enable signal is enabled.

7. The reconfigurable semiconductor memory apparatus of claim 1, wherein the decoder generates the bank selection signal from the external address when the reconfiguration enable signal is disabled.

8. A reconfigurable semiconductor memory apparatus comprising:
- a memory cell array including a plurality of semiconductor chips mounted on a surface of a printed circuit board (PCB), at least one of the plurality of semiconductor chips including a plurality of sub arrays;
- an information storage unit configured to store status information indicating whether or not each of the plurality of sub arrays has operated normally, and a reset address according to the status information of the sub array; and
- an address control circuit,
- wherein the address control circuit includes:
- a comparison unit configured to compare the reset address with an external address, and generate an address hit signal for designating a sub array matching the external address; and
- a decoder configured to generate a bank selection signal based on the address hit signal or the external address in response to a reconfiguration enable signal.

9. The reconfigurable semiconductor memory apparatus of claim 8, wherein the plurality of semiconductor chips are mounted on both surfaces of a PCB.

10. The reconfigurable semiconductor memory apparatus of claim 8, wherein the plurality of semiconductor chips are mounted on only one surface of a PCB.

11. The reconfigurable semiconductor memory apparatus of claim 8, wherein the reset address is assigned to each sub array among the sub arrays that have operated normally.

12. The reconfigurable semiconductor memory apparatus of claim 8, wherein the information storage unit stores the number of sub arrays that have operated normally among the sub arrays.

13. The reconfigurable semiconductor memory apparatus of claim 8, wherein the address control circuit configured to detect a sub array, the sub array assigned to a reset address matching with the external address, when the external address is input, and an access to the memory cell array is requested.

* * * * *